United States Patent
Lu (10) Patent No.: US 11,754,933 B2
(45) Date of Patent: Sep. 12, 2023

(54) MOUNTING FIXTURE OF APPARATUS FOR CLAMPING FILM

(71) Applicant: HIMAX TECHNOLOGIES LIMITED, Tainan (TW)

(72) Inventor: Fang-Wan Lu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 17/935,933

(22) Filed: Sep. 27, 2022

(65) Prior Publication Data

US 2023/0018115 A1 Jan. 19, 2023

Related U.S. Application Data

(62) Division of application No. 16/937,538, filed on Jul. 23, 2020, now Pat. No. 11,485,051.

(51) Int. Cl.
| | |
|---|---|
| G03F 7/20 | (2006.01) |
| B29C 59/02 | (2006.01) |
| B29C 51/26 | (2006.01) |
| G03F 7/00 | (2006.01) |

(52) U.S. Cl.
CPC ........ G03F 7/70825 (2013.01); B29C 51/262 (2013.01); B29C 59/02 (2013.01); Y10S 425/048 (2013.01)

(58) Field of Classification Search
CPC ... B29C 51/262; B29C 59/02; Y10S 425/048; G03F 7/0002; G03F 7/70825
See application file for complete search history.

(56) References Cited

U.S. PATENT DOCUMENTS

| | | | |
|---|---|---|---|
| 2,828,799 A * | 4/1958 | Harrison, Jr. | B29C 51/002 156/286 |
| 4,170,449 A | 10/1979 | Shuman | |
| 5,063,842 A | 11/1991 | Clarke | |
| 5,271,352 A | 12/1993 | Wilson | |
| 2015/0217505 A1* | 8/2015 | Fischer | B29C 59/002 264/293 |

(Continued)

FOREIGN PATENT DOCUMENTS

| | | |
|---|---|---|
| CN | 210942628 U | 7/2020 |
| EP | 3455676 B1 | 9/2019 |
| JP | H02-98445 A | 4/1990 |

(Continued)

*Primary Examiner* — Jerzi H Moreno Hernandez
(74) *Attorney, Agent, or Firm* — CKC & Partners Co., LLC (57) ABSTRACT

A mounting fixture of an apparatus for clamping a film includes a platform, a barricade, and fixing members. A surface of the platform includes a first fixing portion, and second and third fixing portions which are opposite to the first fixing portion. The second fixing portion is adjacent to the third fixing portion and located between the first and third fixing portions. The barricade is disposed on the surface between the second and third fixing portions and has channels. The fixing members are disposed on the surface. First, second, and third bars of the apparatus are disposed on the first, second, and third fixing portions, the barricade is located between the second and third bars, and the channels receive elastic elements of the apparatus. Each elastic element has two ends disposed on the second and third bars. The fixing members can fix the first and third bar.

8 Claims, 6 Drawing Sheets

(56) References Cited

U.S. PATENT DOCUMENTS

| | | |
|---|---|---|
| 2016/0257060 A1 | 9/2016 | Ito et al. |
| 2019/0157562 A1 | 5/2019 | Kim et al. |

FOREIGN PATENT DOCUMENTS

| | | |
|---|---|---|
| JP | H09-1776 A | 1/1997 |
| JP | H11-240129 A | 9/1999 |
| JP | 2002-120351 A | 4/2002 |
| JP | 2002-210916 A | 7/2002 |
| JP | 2015-534721 A | 12/2015 |
| TW | 201342522 A | 10/2013 |
| TW | 201704403 A | 2/2017 |

\* cited by examiner

MOUNTING FIXTURE OF APPARATUS FOR CLAMPING FILM

CROSS REFERENCE

This application is a Divisional Application of the U.S. application Ser. No. 16/937,538, filed Jul. 23, 2020. The entirety of each of these applications is hereby incorporated by reference, including the sequence listings.

BACKGROUND

Field of Invention

The present disclosure relates to a technique for fixing and releasing a soft film. More particularly, the present disclosure relates to a clamping apparatus of soft film and a mounting fixture thereof.

Description of Related Art

A soft film used for an imprinting process is held by a frame. The frame typically includes four bars, and the bars are connected to each other to form a rectangular frame. Four sides of the soft film are respectively fixed on the bars of the frame.

After an imprinting process is completed, the soft film needs to be released from a wafer. In a releasing operation of the soft film, the soft film can be released from the wafer only by raising a side of the frame. Such a releasing operation makes a great impact on pattern structures on an active region of the soft film. The pattern structures are easily damaged by the pulling force during the releasing operation.

SUMMARY

Therefore, one object of the present disclosure is to provide a clamping apparatus of a soft film, which uses a first bar and a second bar to respectively hold two opposite side portions of the soft film. During a releasing operation of the soft film, the first bar is fixed, and the second bar is moved upward or toward the first bar to pull the soft film, such that the soft film is gradually released from a wafer. Thus, the releasing operation can be performed by various release actions.

Another objective of the present disclosure is to provide a clamping apparatus of a soft film, which includes a third bar connected to the second bar through at least one elastic element, such that the elastic element provides the soft film with pull buffer during a releasing operation, thereby protecting the soft film from being damaged.

Further another objective of the present disclosure is to provide a mounting fixture of a clamping apparatus of a soft film, which can position the first bar and the third bar of the clamping apparatus on a platform to provide the soft film with desired tension. Two linking bars are used to correspondingly connect two ends of the first bar and two ends of the third bar, such that the soft film is evenly fixed on the clamping apparatus with desired tension. Thus, the soft film is easily moved and installed on a process apparatus.

According to the aforementioned objectives, the present disclosure provides a clamping apparatus of a soft film. The clamping apparatus includes a first bar, a second bar, a third bar, and at least one elastic element. The first bar is configured to fix a first side portion of a soft film. The second bar is configured to fix a second side portion of the soft film, in which the second side portion is opposite to the first side portion. The third bar is adjacent and connected to the second bar, in which the third bar and the first bar are respectively located on two opposite sides of the second bar, and the third bar is configured to pull the soft film from the second side portion of the soft film through the second bar. The at least one elastic element has a first end and a second end opposite to each other and respectively disposed on the second bar and the third bar, in which the at least one elastic element is configured to provide the soft film with pull buffer.

According to one embodiment of the present disclosure, the at least one elastic element includes various springs.

According to one embodiment of the present disclosure, the springs are disposed between the second bar and the third bar with a constant pitch.

According to one embodiment of the present disclosure, the clamping apparatus further includes at least one load cell disposed on the third bar.

According to one embodiment of the present disclosure, a first end portion and a second end portion opposite to the first end portion in each of the first bar and the third bar respectively have a first through hole and a second through hole.

According to one embodiment of the present disclosure, the clamping apparatus further includes a first linking bar and a second linking bar. Two opposite ends of the first linking bar are respectively disposed in the first through holes of the first bar and the third bar. Two opposite ends of the second linking bar are respectively disposed in the second through holes of the first bar and the third bar.

According to one embodiment of the present disclosure, a sidewall of each of the first through holes and the second through holes has a first engaging portion. Each of the ends of the first linking bar and the second linking bar has a second engaging portion, in which the second engaging portions are configured to be engaged with the first engaging portions correspondingly.

According to one embodiment of the present disclosure, the soft film is an imprinting soft film.

According to the aforementioned objectives, the present disclosure further provides a mounting fixture of a clamping apparatus of a soft film. The mounting fixture includes a platform, a barricade, and various fixing members. A surface of the platform is formed with a first fixing portion, and a second fixing portion and a third fixing portion which are opposite to the first fixing portion. The first fixing portion, the second fixing portion, and the third fixing portion are where a first bar, a second bar, and a third bar of a clamping apparatus of a soft film to be disposed respectively. The barricade is disposed on the surface of the platform between the second fixing portion and the third fixing portion. The barricade has at least one channel for receiving at least one elastic element of the clamping apparatus. Two opposite ends of the at least one elastic element are respectively disposed on the second bar and the third bar. The fixing members are disposed on the surface of the platform and are configured to fix the first bar and the third bar on the surface of the platform.

According to one embodiment of the present disclosure, the mounting fixture further includes a carrying base projected from the surface of the platform and located between the first fixing portion and the second fixing portion. The carrying base is configured to carry the soft film to be held by the clamping apparatus.

According to one embodiment of the present disclosure, the carrying base has various vacuum channels, and the vacuum channels are configured to provide the soft film with vacuum.

According to one embodiment of the present disclosure, the mounting fixture further includes a first fixing block and a second fixing block. The first fixing block is disposed on the surface of the platform and is adjacent to the first fixing portion. The first fixing block is configured to position the first bar. The second fixing block is disposed on the surface of the platform and is adjacent to the third fixing portion. The second fixing block is configured to form a groove as the third fixing portion with the barricade.

According to one embodiment of the present disclosure, the platform further includes a first concave portion recessed in the first fixing block and the first fixing portion, and a second concave portion recessed in the second fixing block and the third fixing portion. When the clamping apparatus is disposed on the platform, the first bar and the third bar are respectively located over the first concavity portion and the second concavity portion.

According to one embodiment of the present disclosure, the at least one channel includes channels, the at least one elastic element includes elastic elements, a quality of the channels is the same as a quality of the elastic elements, and the channels are disposed with a constant pitch.

According to one embodiment of the present disclosure, the barricade is movably disposed on the surface of the platform toward the second fixing portion and the third fixing portion.

According to one embodiment of the present disclosure, each of the fixing members includes a caliper.

According to one embodiment of the present disclosure, a first end portion and a second end portion opposite to the first end portion of each of the first bar and the third bar respectively have a first through hole and a second through hole.

According to one embodiment of the present disclosure, the clamping apparatus further includes a first linking bar and a second linking bar. When two opposite side portions of the soft film are respectively clipped on the first bar and the second bar which is disposed on the mounting fixture, two opposite ends of the first linking bar are respectively disposed in the first through holes of the first bar and the third bar, and two opposite ends of the second linking bar are respectively disposed in the second through holes of the first bar and the third bar.

According to one embodiment of the present disclosure, a sidewall of each of the first through holes and the second through holes has a first engaging portion. Each of the ends of the first linking bar and the second linking bar has a second engaging portion. The second engaging portions are configured to be engaged with the first engaging portions correspondingly.

According to one embodiment of the present disclosure, the clamping apparatus is configured to fix an imprinting soft film by using the first bar and the second bar.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
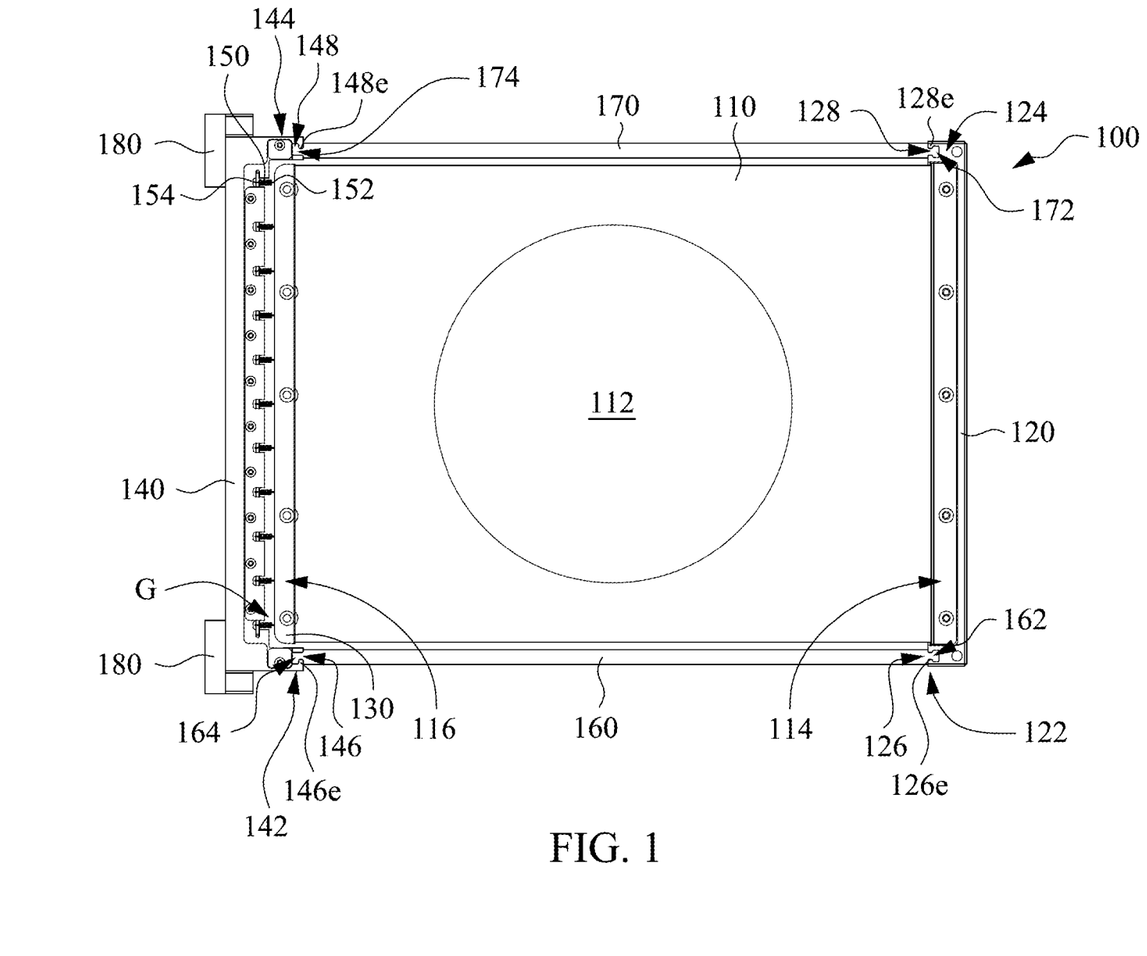
FIG. 1 is a schematic top view of a clamping apparatus of a soft film in accordance with one embodiment of the present disclosure.

FIG. 1 is a schematic top view of a clamping apparatus of a soft film in accordance with one embodiment of the present disclosure. A clamping apparatus 100 is configured to evenly hold a soft film 110 for transporting and loading on a process apparatus. After a process, such as an imprinting process, is completed, the clamping apparatus 100 is configured to gradually release the soft film 110 from a wafer by pulling one side portion of the soft film 110 upward or toward an opposite side portion of the soft film 110. In some examples, the soft film 110 is an imprinting soft film and includes various imprinting pattern structures on its active region 112. The soft film 110 includes a first side portion 114 and a second side portion 116, which are on two opposite sides of the soft film 110.

Referring to FIG. 1, the clamping apparatus 100 may mainly include a first bar 120, a second bar 130, a third bar 140, and at least one elastic element 150. The first bar 120, the second bar 130, and the third bar 140 may be formed from a high strength plastic material or metal, such as aluminum or stainless steel. The first bar 120 is configured to fix the first side portion 114 of the soft film 110. For example, the first side portion 114 of the soft film 110 may be fixed on the first bar 120 by using screws or a magnetic force.

The first bar 120 has a first end portion 122 and a second end portion 124, which are opposite to each other. In some examples, the first bar 120 has a first through hole 126 and a second through hole 128, in which the first through hole 126 passes through the first end portion 122, and the second through hole 128 passes through the second end portion 124. In some exemplary examples, sidewalls of the first through hole 126 and the second through hole 128 respectively have first engaging portions 126e and 128e. For example, the first engaging portions 126e and 128e may be protrusions protruding from the sidewalls of the first through hole 126 and the second through hole 128.

The second bar 130 is configured to hold the second side portion 116 of the soft film 110, such that the second bar 130 and the first bar 120 respectively fix two opposite sides of the soft film 110. Similarly, the second side portion 116 of the soft film 110 may be fixed on the second bar 130 by using screws or a magnetic force. Thus, the clamping apparatus 100 may fix the soft film 110 by using the first bar 120 and the second bar 130.

The third bar 140 is adjacent to the second bar 130 and is connected to the second bar 130. The third bar 140 may be separated from the second bar 130 by a gap G. The third bar 140 may move or rotate in relation to the second bar 130. The third bar 140 and the first bar 120 are respectively located on two opposite sides of the second bar 130. The third bar 140 is configured to pull the second bar 130, such that the soft film 110 is pulled from the second side portion 116 by the second bar 130.

The third bar 140 has a first end portion 142 and a second end portion 144 opposite to the first end portion 142. In some examples, the third bar 140 has a first through hole 146 and a second through hole 148. The first through hole 146 passes through the first end portion 142, and the second through hole 148 passes through the second end portion 144. In some exemplary examples, sidewalls of the first through hole 146 and the second through hole 148 respectively have first engaging portions 146e and 148e. The first engaging portions 146e and 148e may be, for example, protrusions protruding from the sidewalls of the first through hole 146 and the second through hole 148.

In the example shown in FIG. 1, a quality of the at least one elastic element 150 is more than 1. In some examples, the elastic elements 150 are springs. Each of the elastic elements 150 has a first end 152 and a second end 154, which are opposite to each other. The first end 152 and the second end 154 of the elastic element 150 are respectively disposed on the second bar 130 and the third bar 140. The elastic elements 150 are configured to provide the soft film 110 with pull buffer. In some exemplary examples, the elastic elements 150 are disposed between the second bar 130 and the third bar 140 with a constant pitch to provide the soft film 110 with uniform tension buffer.

Figure 2A:
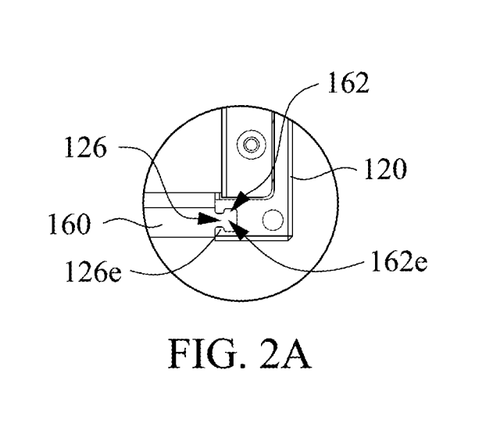
FIG. 2A through FIG. 2D are partially-enlarged diagrams of a clamping apparatus of a soft film in accordance with one embodiment of the present disclosure.
Figure 2B:
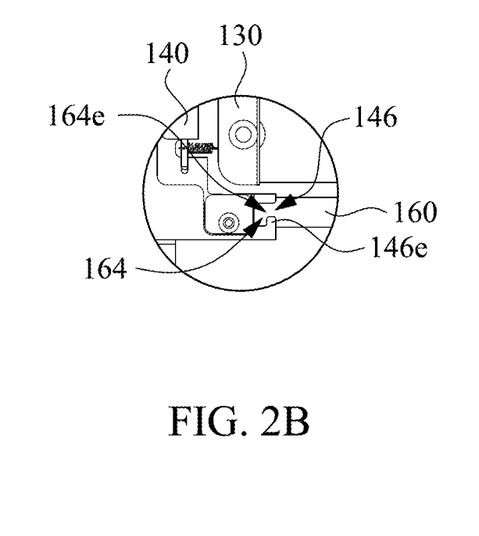

In some examples, the clamping apparatus 100 may further include a first linking bar 160 and a second linking bar 170. The first linking bar 160 has two opposite ends 162 and 164. The ends 162 and 164 of the first linking bar 160 are respectively disposed in the first through hole 126 of the first bar 120 and the first through hole 146 of the third bar 140. The ends 162 and 164 of the first linking bar 160 can be removed from the first bar 120 and the third bar 140 upwardly and downwardly. In some exemplary examples, as shown in FIG. 2A and FIG. 2B, the ends 162 and 164 of the first linking bar 160 respectively have second engaging portions 162e and 164e. The second engaging portions 162e and 164e can be engaged with the first engaging portions 126e and 146e correspondingly, such that the first linking bar 160 is fixed between the first bar 120 and the third bar 140.

Figure 2C:
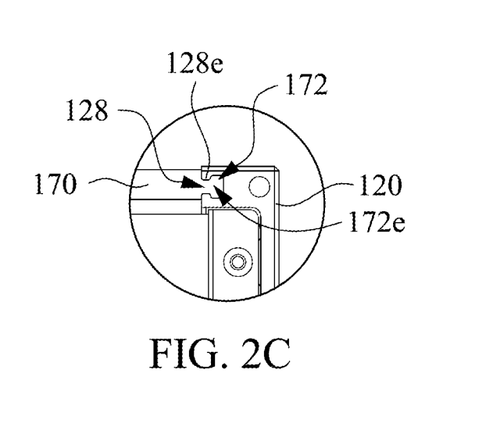
Figure 2D:
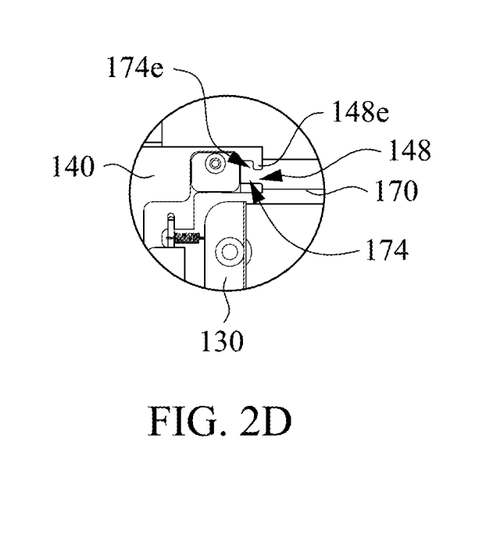

Similarly, the second linking bar 170 has two opposite ends 172 and 174. The ends 172 and 174 of the second linking bar 170 are respectively disposed in the second through hole 128 of the first bar 120 and the second through hole 148 of the third bar 140. The ends 172 and 174 of the second linking bar 170 also can be removed from the first bar 120 and the third bar 140 upwardly and downwardly. As shown in FIG. 2C and FIG. 2D, the ends 172 and 174 of the second linking bar 170 may respectively have second engaging portions 172e and 174e. The second engaging portions 172e and 174e can be engaged with the first engaging portions 128e and 148e correspondingly, such that the second linking bar 170 is fixed between the first bar 120 and the third bar 140.

When the first side portion 114 and the second side portion 116 of the soft film 110 are respectively held by the first bar 120 and the second bar 130, the first linking bar 160 and the second linking bar 170 connected between the first bar 120 and the third bar 140 can spread the soft film 110, such that the soft film 110 is evenly held by the clamping apparatus 100. When the soft film 110 is used in a process, the first bar 120 is fixed on a process tool, and the first linking bar 160 and the second linking bar 170 are removed, such that the second side portion 116 of the soft film 110 can be pulled upward or toward the first side portion 114 by moving the third bar 140 to pull the second bar 130. Thus, the soft film 110 is released from a wafer by using different methods. A releasing angle of the soft film 110 may be from greater than 0 degree to 180 degrees.

In some examples, the clamping apparatus 100 may further include at least one load cell 180. In the example illustrated in FIG. 1, the clamping apparatus 100 includes two load cells 180, and the load cells 180 are disposed on the third bar 140. The load cells 180 may be respectively located on two opposite end portions of the third bar 140. The load cells 180 measure and show the variation of the pull applied to the soft film 110 immediately, such that an operator can adjust the pulling force according the measured result.

Figure 3:
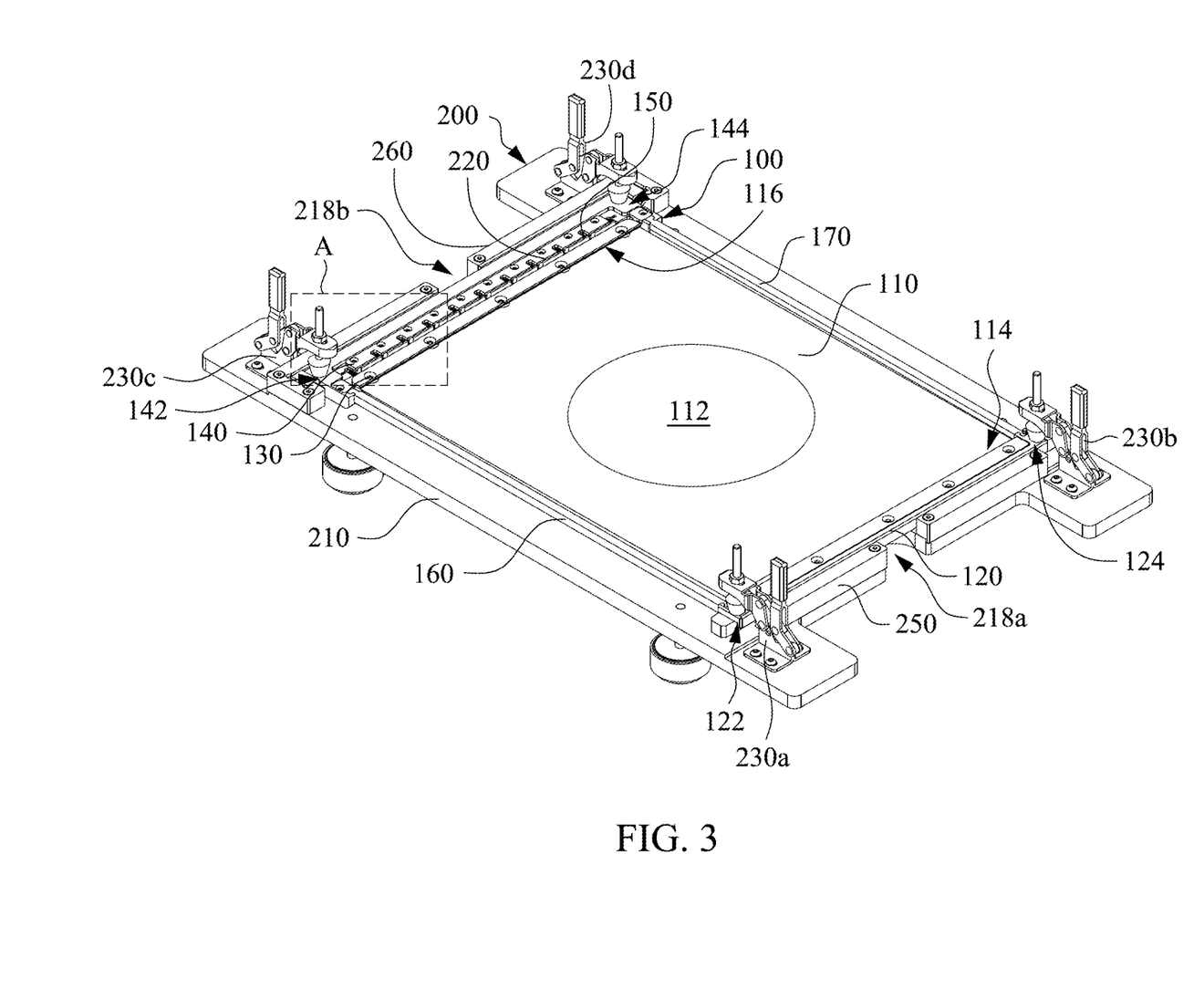
FIG. 3 is a schematic diagram of a clamping apparatus of a soft film disposed on a mounting fixture in accordance with one embodiment of the present disclosure.
Figure 4:
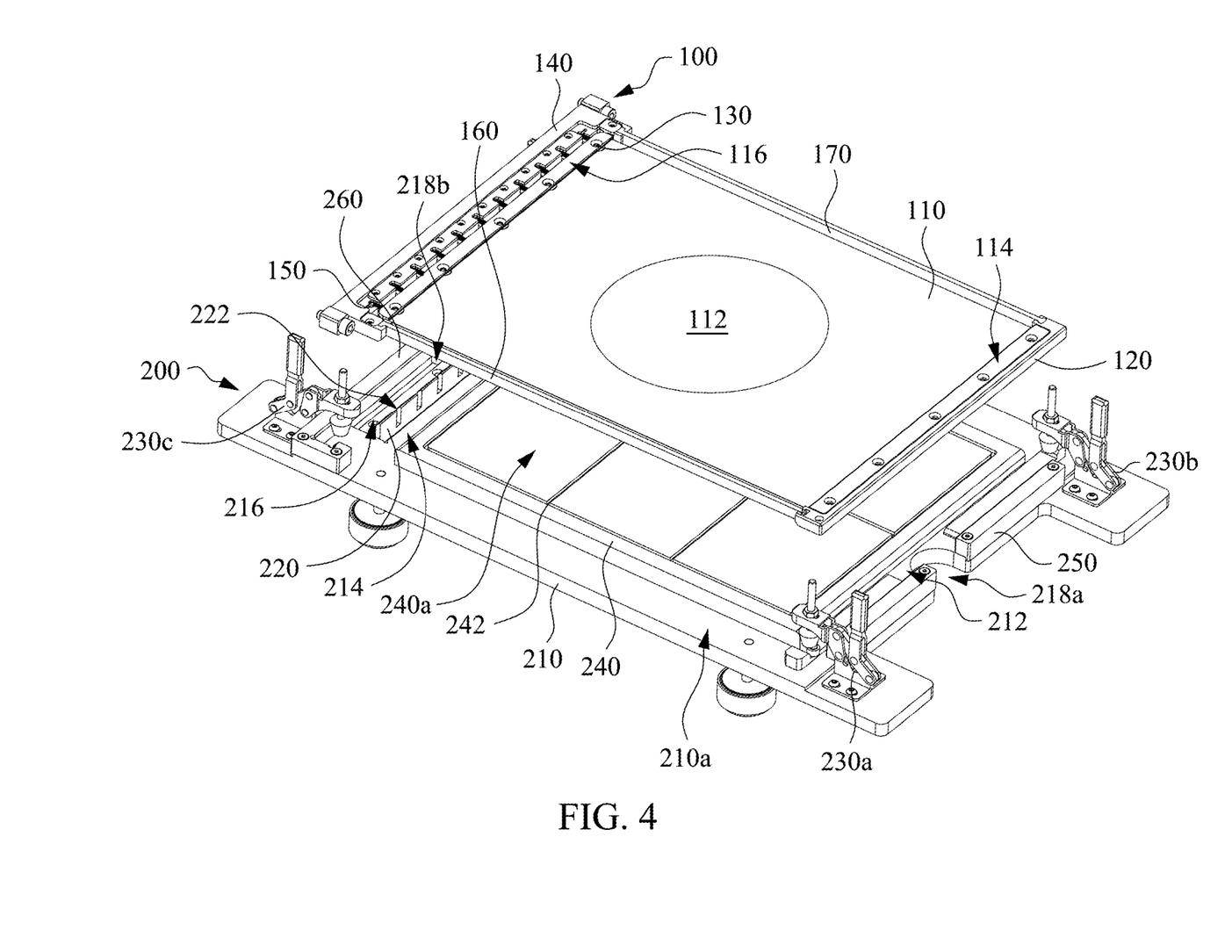
FIG. 4 is a schematic diagram of a clamping apparatus of a soft film removing from a mounting fixture in accordance with one embodiment of the present disclosure.

FIG. 3 is a schematic diagram of a clamping apparatus of a soft film disposed on a mounting fixture in accordance with one embodiment of the present disclosure, and FIG. 4 is a schematic diagram of a clamping apparatus of a soft film removing from a mounting fixture in accordance with one embodiment of the present disclosure. The soft film 110 may be set on the clamping apparatus 100 by using a mounting fixture 200. The mounting fixture 200 may mainly include a platform 210, a barricade 220, and various fixing members 230a-230d.

The platform 210 is a plate structure. The platform 210 may be formed from metal, such as stainless steel. The platform 210 may be configured to carry and fix the clamping apparatus 100 during setting of the soft film 110. The platform 210 has a surface 210a. In some examples, the platform 210 includes a first fixing portion 212, a second fixing portion 214, and a third fixing portion 216 disposed on the surface 210a of the platform 210. The second fixing portion 214 and the third fixing portion 216 are opposite to the first fixing portion 212. The first bar 120, the second bar 130, and the third bar 140 are respectively disposed on the first fixing portion 212, the second fixing portion 214, and the third fixing portion 216.

In some examples, as shown in FIG. 4, the mounting fixture 200 further includes a carrying base 240. The carrying base 240 is located between the first fixing portion 212 and the second fixing portion 214, and is projected from the surface 210a of the platform 210. The carrying base 240 may carry the soft film 110 during setting the soft film 110 onto the clamping apparatus 100.

In some exemplary examples, as shown in FIG. 4, the carrying base 240 has various vacuum channels 242. The vacuum channels 242 are recessed in a surface 240a of the carrying base 240. The vacuum channels 242 may provide the soft film 110 disposed on the surface 240a of the carrying base 240 with vacuum by connecting to a vacuum-pumping device (not shown).

As shown in FIG. 4, the barricade 220 is disposed on the surface 210a of the platform 210. The second fixing portion 214 is located between the barricade 220 is and the carrying base 240, such that the second fixing portion 214 is a groove defined by the barricade 220 and the carrying base 240. The barricade 220 is located between the second fixing portion 214 and the third fixing portion 216.

Figure 5:
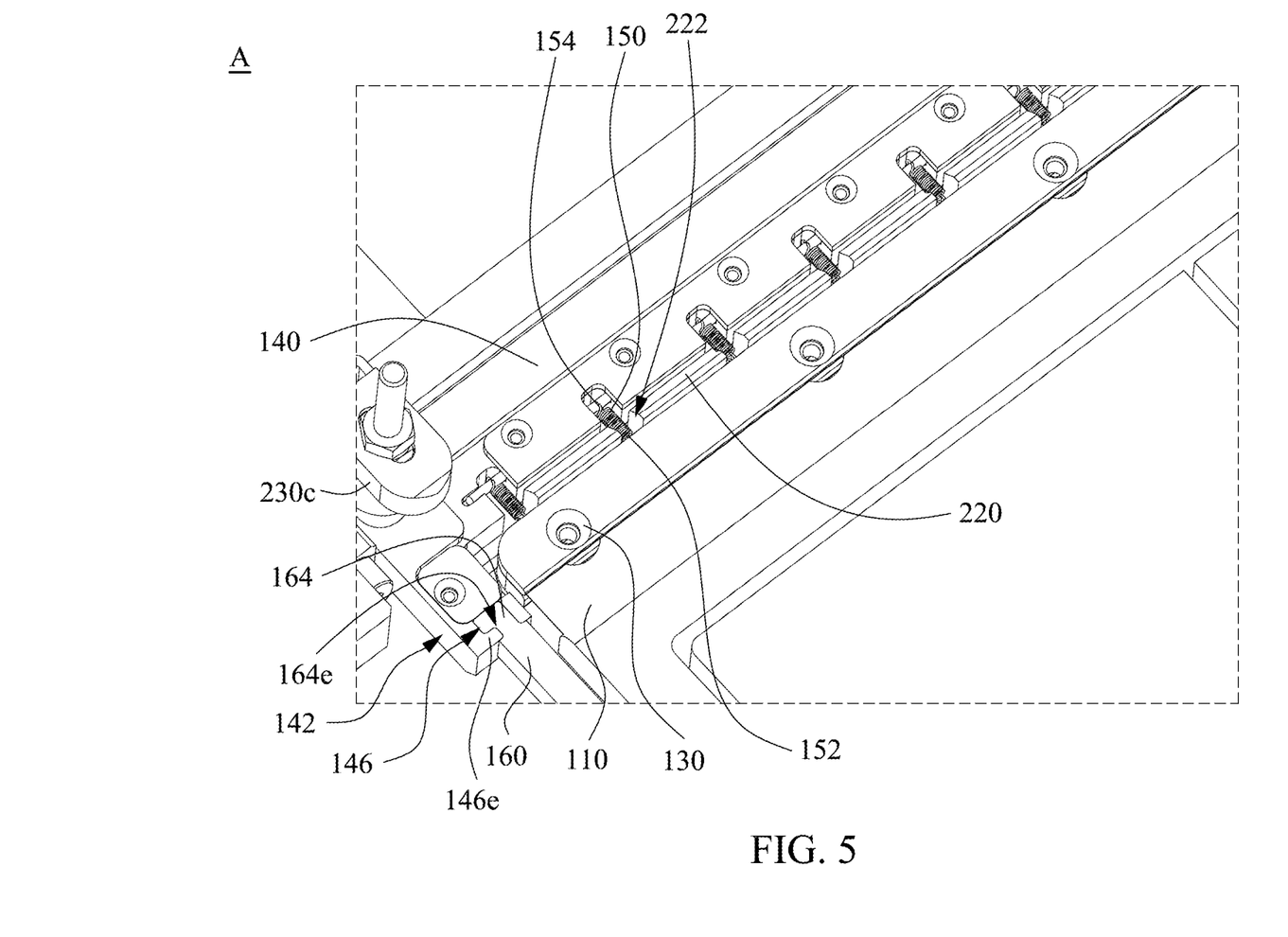
FIG. 5 is a schematic enlarged diagram of a section A in FIG. 3.

Referring to FIG. 5, FIG. 5 is a schematic enlarged diagram of a section A in FIG. 3. The second bar 130 and the third bar 140 are respectively located on two opposite sides of the barricade 220, and the two ends 152 and 154 of each elastic element 150 are respectively disposed on the second bar 130 and the third bar 140. Thus, the barricade 220 has at least one channel 222 passing through the barricade 220 for receiving the at least one elastic element 150 of the clamping apparatus 100. In the example shown in FIG. 5, the barricade 220 has various channels 222, and a quality of the channels 222 may be the same as that of the elastic elements 150 for correspondingly receiving the elastic elements 150. In some examples, the channels 222 are formed in the barricade 220 with a constant pitch. The barricade 220 is movably disposed on the surface 210a of the platform 212, such that the barricade 220 can move toward the second fixing portion 214 and the third fixing portion 216, i.e. the barricade 220 can move between the second fixing portion 214 and the third fixing portion 216.

In some examples, as shown in FIG. 4, the mounting fixture 200 may optionally include a first fixing block 250 and a second fixing block 260. The first fixing block 250 is disposed on the surface 210a of the platform 210. The first fixing block 250 is adjacent to the first fixing portion 212, and the first fixing portion 212 is located between the first fixing block 250 and the carrying base 240, such that the first fixing portion 212 is a groove defined by the first fixing block 250 and the carrying base 240. Thus, the first fixing block 250 may be used to position the first bar 120 in the first fixing portion 212.

The second fixing block 260 is disposed on the surface 210a of the platform 210. The second fixing block 260 is adjacent to the third fixing portion 216, and the third fixing portion 216 is located between the second fixing block 260 and the barricade 220, such that the third fixing portion 216 is a groove formed by the second fixing block 260 and the barricade 220.

Referring to FIG. 3 and FIG. 4, the platform 210 may optionally include a first concave portion 218a and a second concave portion 218b. The first concave portion 218a and the second concave portion 218b are respectively located two opposite sides of the platform 210. The first concave portion 218a is recessed in the first fixing block 250 and the first fixing portion 212. The second concave portion 218b is recessed in the second fixing block 260 and the third fixing portion 216. Therefore, when the clamping apparatus 100 is disposed on the surface 210a of the platform 210, the first bar 120 and the third bar 140 are respectively located over the first concavity portion 218a and the second concavity portion 218b, such that the operator can take the clamping apparatus 100 and the soft film 110 held by the clamping apparatus 100 through the first concavity portion 218a and the second concavity portion 218b easily.

As shown in FIG. 3, the fixing members 230a-230d are disposed on the surface 210a of the platform 210. In some exemplary examples, the fixing members 230a and 230b are respectively adjacent to the first end portion 122 and the second end portion 124 of the first bar 120, and respectively pin the first end portion 122 and the second end portion 124 to fix the first bar 130 on the surface 210a of the platform 210. In addition, the fixing members 230c and 230d are respectively adjacent to the first end portion 142 and the second end portion 144 of the third bar 140, and respectively pin the first end portion 142 and the second end portion 144 to fix the third bar 140 on the surface 210a of the platform 210. The fixing members 230a-230d may be any members which can fix the first bar 120 and the third bar 140 on the surface 210a of the platform 210. For example, each of the fixing members 230a-230d may include a caliper, such that the first bar 120 and the third bar 140 are fixed and released easily and quickly.

Referring to FIG. 1, FIG. 3, and FIG. 4, in the setting of the soft film 110, the clamping apparatus 100 is disposed on the surface 210a of the platform 210. The first bar 120, the second bar 130, and the third bar 140 are respectively positioned on the first fixing portion 212, the second fixing portion 214, and the third fixing portion 216. The first bar 120 and the third bar 140 are respectively fixed on the surface 210a of the platform 210 by the fixing members 230a and 230b and the fixing members 230c and 230d. The soft film 110 is provided, and the first side portion 114 of the soft film 110 is fixed on the first bar 120. Then, a vacuum-pumping operation is performed through the vacuum channels 242 on the surface 240a of the carrying base 240, so as to absorb the soft film 110 on the surface 242a of the carrying base 240. Next, the second side portion 116 is fixed on the second bar 130. In some examples, the barricade 220 may be removed toward the second bar 130 or toward the third bar 140 to adjust the tension of the soft film 110.

Then, the ends 162 and 164 of the first linking bar 160 are respectively put into the first through hole 126 of the first bar 120 and the first through hole 146 of the third bar 140 to dispose the first linking bar 160 between the first bar 120 and the third bar 140. Similarly, the ends 172 and 174 of the second linking bar 170 are respectively put into the second through hole 128 of the first bar 120 and the second through hole 148 of the third bar 140 to dispose the second linking bar 170 between the first bar 120 and the third bar 140. The soft film 110 is evenly held by the clamping apparatus 100, and the fixing members 230a-230d are opened to release the first bar 120 and the third bar 140.

As shown in FIG. 4, the operator can take the clamping apparatus 100 with the soft film 110 from the mounting fixture 200 through the first concave portion 218a and the second concave portion 218b. In some examples, the soft film 110 is an imprinting soft film, and imprinting pattern structures in the active region 112 are upward when the clamping apparatus 100 is mounted on the mounting fixture 200.

Figure 6:
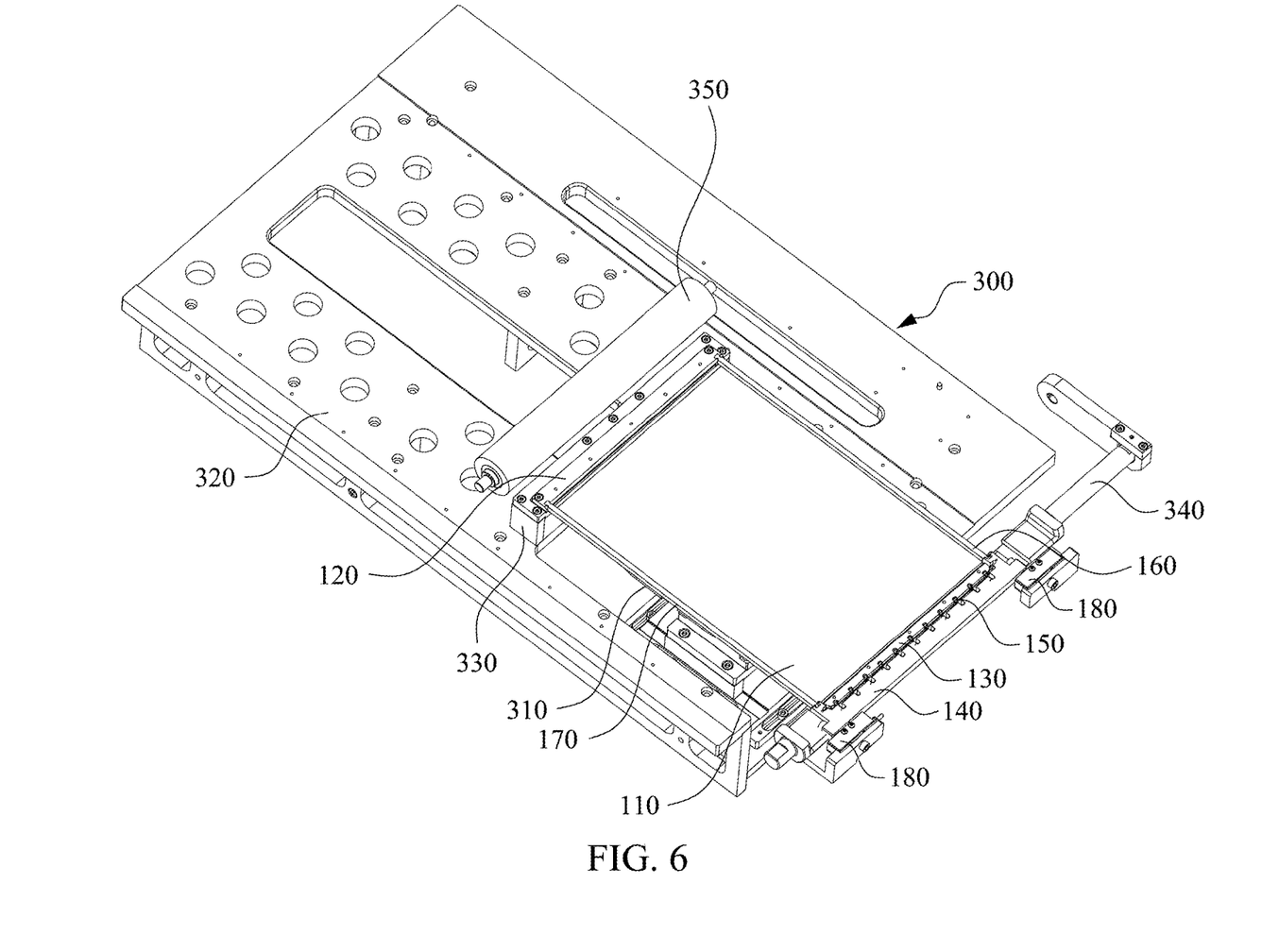
FIG. 6 is a schematic diagram of a clamping apparatus of a soft film disposed on an imprinting apparatus in accordance with one embodiment of the present disclosure.

FIG. 6 is a schematic diagram of a clamping apparatus of a soft film disposed on an imprinting apparatus in accordance with one embodiment of the present disclosure. When the soft film 110 is applied to an imprinting process, which is performed on an imprinting apparatus 300, the clamping apparatus 100 is reversed to turn the active region 112 to face a wafer (not shown), which is carried by a chuck 310 of the imprinting apparatus 300. The imprinting apparatus 300 may mainly include the chuck 310, a bench 320, a fixing base 330, a transmission shaft 340, and a roller 350. The wafer may be fixed on the chuck 310 by vacuum-absorption or electrostatic absorption. The fixing base 330, the transmission shaft 340, and the roller 350 are disposed on the bench 320. The chuck 310 is disposed in the bench 320 and is located between the fixing base 330 and the transmission shaft 340.

The first bar 120 may be fixed on the fixing base 330, and the third bar 140 may be fixed on the transmission shaft 340, such that the soft film 110 may be located over the chuck 310. The third bar 140 may be driven upward or toward the first bar 120 by the transmission shaft 340. The roller 350 may roll over the chuck 310.

When the imprinting process is performed, a wafer (not shown) is fixed on the chuck 310, and the clamping apparatus 100 is reversed, such that the active region 112 of the soft film 110 faces the wafer. The first linking bar 160 and the second linking bar 170 of the clamping apparatus 100 are removed. Then, the roller 350 may roll on the soft film 110 to press the active region 112 of the soft film 110 onto the wafer, so as to transfer the pattern structures on the active region 112 to the wafer. The roller 350 may roll on the soft film 110 from the first bar 120 to the second bar 130.

After the pattern structures on the active region 112 of the soft film 110 are transferred onto the wafer, a curing treatment may be performed on the wafer by using, for example, ultraviolet light. Next, a releasing operation of the soft film 110 is performed. In the releasing operation, the roller 350 gradually rolls on the soft film 110 from the second bar 130 toward the first bar 120, and the transmission shaft 340 moves to drive the third bar 140 to pull the second bar 130, so as to release the soft film 110 from the wafer. In some examples, the third bar 140 is pulled upward and is curved toward while the roller 350 rolls toward the first bar 120. In other examples, the third bar 140 is pulled upward during the releasing operation. In yet other examples, the third bar 140 is pulled toward the first bar 120 and across the roller 350. A releasing rate of the soft film 110 may be controlled by the roller 350 and the transmission shaft 340.

According to the aforementioned embodiments, one advantage of the present disclosure is that a clamping apparatus of a soft film uses a first bar and a second bar to respectively hold two opposite side portions of the soft film. During a releasing operation of the soft film, the first bar is fixed, and the second bar is moved upward or toward the first bar to pull the soft film, such that the soft film is gradually released from a wafer. Thus, the releasing operation can be performed by various release actions.

According to the aforementioned embodiments, another advantage of the present disclosure is that a clamping apparatus includes a third bar connected to the second bar through at least one elastic element, such that the elastic element provides the soft film with pull buffer during a releasing operation, thereby protecting the soft film from being damaged.

According to the aforementioned embodiments, further another advantage of the present disclosure is that a mounting fixture of a clamping apparatus of a soft film can position the first bar and the third bar of the clamping apparatus on a platform to provide the soft film with desired tension. Two linking bars are used to correspondingly connect two ends of the first bar and two ends of the third bar, such that the soft film is evenly fixed on the clamping apparatus with desired tension. Thus, the soft film is easily moved and installed on a process apparatus.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A mounting fixture of an apparatus for clamping a film, wherein the apparatus comprises a first bar, a second bar, a third bar, and at least one elastic element, the at least one elastic element has two opposite ends respectively disposed on the second bar and the third bar, and the mounting fixture comprises:
   a platform, wherein a surface of the platform is formed with a first fixing portion, and a second fixing portion and a third fixing portion which are opposite to the first fixing portion, the second fixing portion is adjacent to the third fixing portion, and the second fixing portion is located between the first fixing portion and the third fixing portion;
   a barricade disposed on the surface of the platform and located between the second fixing portion and the third fixing portion, wherein the barricade has at least one channel; and
   a plurality of fixing members disposed on the surface of the platform,
   wherein when the apparatus is arranged on the surface of the platform, the first bar, the second bar, and the third bar are respectively disposed on the first fixing portion, the second fixing portion, and the third fixing portion, the barricade is located between the second bar and the third bar, the at least one channel receives the at least one elastic element of the apparatus, and the fixing members fix the first bar and the third bar respectively on the first fixing portion and the third fixing portion of the surface of the platform.

2. The mounting fixture of claim 1, further comprising a carrying base projected from the from the surface of the platform and located between the first fixing portion and the second fixing portion, wherein the carrying base is configured to carry the film to be held by the apparatus.

3. The mounting fixture of claim 2, wherein the carrying base has a plurality of vacuum channels, and the vacuum channels are configured to provide the film with vacuum.

4. The mounting fixture of claim 1, further comprising:
   a first fixing block disposed on the surface of the platform and adjacent to the first fixing portion, wherein the first fixing block is configured to position the first bar; and
   a second fixing block disposed on the surface of the platform and adjacent to the third fixing portion, wherein a groove is formed between the second fixing block and the barricade.

5. The mounting fixture of claim 4, wherein the platform further comprises:
   a first concave portion recessed in the first fixing block and the first fixing portion; and
   a second concave portion recessed in the second fixing block and the third fixing portion,
   wherein when the apparatus is disposed on the platform, the first bar and the third bar are respectively located over the first concave portion and the second concave portion.

6. The mounting fixture of claim 1, wherein the at least one channel comprises channels, and the channels are disposed with a constant pitch, and
   wherein the at least one elastic element of the apparatus comprises elastic elements, and when the first bar, the second bar, and the third bar are respectively disposed on the first fixing portion, the second fixing portion, and the third fixing portion, the channels correspondingly receive the elastic elements of the apparatus.

7. The mounting fixture of claim 1, wherein the barricade is movably disposed on the surface of the platform toward the second fixing portion and the third fixing portion.

8. The mounting fixture of claim 1, wherein each of the fixing members comprises a caliper.

\* \* \* \* \*